United States Patent
Itakura et al.

(10) Patent No.: US 6,713,941 B2
(45) Date of Patent: Mar. 30, 2004

(54) SURFACE ACOUSTIC WAVE ELEMENT

(75) Inventors: Katsuhiro Itakura, Itami (JP); Akihiro Hachigo, Itami (JP); Hideaki Nakahata, Itami (JP); Satoshi Fujii, Itami (JP); Shinichi Shikata, Itami (JP)

(73) Assignee: Seiko Epson Corporation, Nagano-ken (JP)

( * ) Notice: Subject to any disclaimer, the term of this patent is extended or adjusted under 35 U.S.C. 154(b) by 13 days.

(21) Appl. No.: 10/204,454

(22) PCT Filed: Mar. 19, 2001

(86) PCT No.: PCT/JP01/02185

§ 371 (c)(1),
(2), (4) Date: Aug. 21, 2002

(87) PCT Pub. No.: WO01/71910

PCT Pub. Date: Sep. 27, 2001

(65) Prior Publication Data

US 2003/0011281 A1 Jan. 16, 2003

(30) Foreign Application Priority Data

Mar. 24, 2000 (JP) .......................... 2000-085088

(51) Int. Cl.[7] .............. H03H 9/25; H03H 9/145
(52) U.S. Cl. ................. 310/313 B; 310/313 R
(58) Field of Search ................ 310/313 B, 313 R

(56) References Cited

U.S. PATENT DOCUMENTS

| | | | | |
|---|---|---|---|---|
| 5,235,233 A | * | 8/1993 | Yamamoto | 310/313 A |
| 5,446,329 A | | 8/1995 | Nakahata et al. | 310/313 A |
| 6,337,531 B1 | | 1/2002 | Nakahata et al. | 310/313 R |
| 2003/0022412 A1 | * | 1/2003 | Higgins et al. | 438/50 |

FOREIGN PATENT DOCUMENTS

| | | | |
|---|---|---|---|
| JP | 53-94154 | 8/1978 | ............ H03H/3/10 |
| JP | 60-39909 | 3/1985 | ............ H03H/9/25 |
| JP | 1-226207 | 9/1989 | ........... H03H/9/145 |
| JP | 2-20910 | 1/1990 | ........... H03H/9/145 |
| JP | 6-164294 | 6/1994 | ........... H03H/9/145 |
| JP | 9-51248 | 2/1997 | ............ H03H/9/25 |
| JP | 9-98059 | 4/1997 | ............ H03H/9/25 |
| JP | 10-276061 | 10/1998 | ............ H03H/9/25 |

OTHER PUBLICATIONS

U.S. patent application Ser. No. 09/959,954, Itakura et al., filed Nov. 13, 2001.
U.S. patent application Ser. No. 10/089,816, Itakura et al., filed Apr. 4, 2002.
U.S. patent application Ser. No. 10/089,804, Hachigo et al., filed Apr. 4, 2002.

* cited by examiner

*Primary Examiner*—Thomas M. Dougherty
(74) *Attorney, Agent, or Firm*—McDermott, Will & Emery

(57) ABSTRACT

A surface acoustic wave (SAW) device that is suitable for mass production and that has excellent operational performance at the superhigh-frequency range. The SAW device comprises (a) a diamond layer 3; (b) a ZnO layer 4, with a thickness of tz, formed on the diamond layer 3; (c) interdigital transducers (IDTs) 5, which excite and receive a SAW, formed on the ZnO layer 4; and (d) an $SiO_2$ layer 6, with a thickness of ts, formed on the ZnO layer 4 so that the $SiO_2$ layer can cover the IDTs 5. The structure of the SAW device is determined by specific numeric ranges of the parameters kh1 and kh2, which are given in equations $kh1 = 3 \cdot 2\pi \cdot (tz/\lambda)$ and $kh2 = 3 \cdot 2\pi \cdot (ts/\lambda)$, where $\lambda$ signifies the wavelength of the fundamental wave of the second Sezawa mode of the SAW. The SAW device uses the third harmonic of the second Sezawa mode of the SAW excited.

2 Claims, 7 Drawing Sheets

SURFACE ACOUSTIC WAVE ELEMENT

TECHNICAL FIELD

The present invention relates to a surface acoustic wave (SAW) device incorporating diamond, and particularly to a SAW device that has excellent operational performance even at frequency ranges such as gigahertz and higher-frequency bands.

BACKGROUND ART

As stated in the published Japanese patent application Tokukaihei 10-276061, a typical SAW device incorporating diamond is known to be produced by forming a ZnO layer on a diamond layer, forming on the ZnO layer interdigital electrodes (IDTs), which excite and receive SAWs, and finally forming an $SiO_2$ layer on the ZnO layer such that the $SiO_2$ layer covers the IDTs.

The SAW device is intended to accomplish not only excellent propagation, electromechanical coupling, and frequency-temperature properties but also low propagation loss by obtaining an optimum combination of the thicknesses of the IDTs, ZnO layer, and $SiO_2$ layer. The SAW device achieves a frequency temperature property of −15 to +15 ppm/° C. and an electromechanical coupling coefficient of 0.1 to 1.3% at a propagation velocity of 8,000 to 12,000 m/s.

However, when the implementation of the conventional SAW device is planned for use at a frequency band as high as 10 GHz or so, even if the propagation velocity is increased to 10,000 m/s, it is necessary to reduce the sum of the width of the digit electrode and the distance between the neighboring digit electrodes of the IDTs to 0.5 μm or so and the width of the digit electrode to 0.25 μm or so. This requirement is disadvantageous for mass production of the SAW device.

Moreover, a conventional material such as quartz has a limited propagation velocity of 3,150 m/s, and therefore, cannot be used for a SAW device for the superhigh-frequency band.

The conventional SAW device has another drawback in that the electromechanical coupling coefficient decreases at the superhigh-frequency band. In particular, the electromechanical coupling coefficient at the third harmonic varies with the metal ratio of the digit electrode portion of the IDTs. When the metal ratio is 0.5, the electromechanical coupling coefficient becomes zero. Here, the metal ratio represents the ratio dm/(dm+df), where dm is the width of the digit electrode and df is the distance between the neighboring digit electrodes. For example, a SAW device made with quartz, which has an electromechanical coupling coefficient of 0.1% at the fundamental wave, reduces the coefficient to 0.03% at the third harmonic when the metal ratio is 0.3. To achieve a center frequency of 10 GHz requires the value of "dm+df" to be 0.47 mm and the value of dm to be 0.14 mm even at the third harmonic. This requirement makes it difficult to mass-produce SAW devices. An extension of the band width of the operating frequency requires an increase in the electromechanical coupling coefficient. This increase requires a further reduction in the metal ratio, making mass production of the SAW device increasingly difficult.

The present invention aims to solve the foregoing problems, and its object is to offer a SAW device that is suitable for mass production and that has excellent operational performance at the superhigh-frequency range.

DISCLOSURE OF THE INVENTION

A SAW device of the present invention comprises:
(a) a diamond layer;
(b) a ZnO layer, with a thickness of tz, formed on the diamond layer;
(c) IDTs, which excite and receive a SAW, formed on the ZnO layer; and
(d) an $SiO_2$ layer, with a thickness of ts, formed on the ZnO layer so that the $SiO_2$ layer can cover the IDTs.

In order to determine the structure of the SAW device, a two-dimensional orthogonal-coordinate system is provided, in which the axis of abscissa represents kh1 and the axis of ordinate represents kh2. In the above description, kh1 and kh2 are given in the following equations:

$$kh1 = 3 \cdot 2\pi \cdot (tz/\lambda); \text{ and}$$

$$kh2 = 3 \cdot 2\pi \cdot (ts/\lambda),$$

where λ signifies the wavelength of the fundamental wave of the second Sezawa mode of the SAW.

In the orthogonal-coordinate system, the range ABCDEFGHIJKLA is provided by connecting sequentially the following 12 points with 12 lengths of lines:

point A given by the coordinates "kh1=0.30 and kh2=0.87";
point B given by the coordinates "kh1=0.54 and kh2=0.87";
point C given by the coordinates "kh1=0.60 and kh2=0.87";
point D given by the coordinates "kh1=0.81 and kh2=0.97";
point E given by the coordinates "kh1=1.16 and kh2=1.20";
point F given by the coordinates "kh1=1.52 and kh2=0.93";
point G given by the coordinates "kh1=1.69 and kh2=0.77";
point H given by the coordinates "kh1=1.31 and kh2=0.59";
point I given by the coordinates "kh1=1.04 and kh2=0.50";
point J given by the coordinates "kh1=0.68 and kh2=0.40";
point K given by the coordinates "kh1=0.63 and kh2=0.33";
point L given by the coordinates "kh1=0.30 and kh2=0.63"; and
point A The combination of kh1 and kh2 is determined so that it can fall in the range ABCDEFGHIJKLA including the surrounding 12 lengths of lines. The SAW device uses the third harmonic of the second Sezawa mode of the SAW. The third harmonic of the second Sezawa mode of the SAW has a propagation velocity, denoted by v, of 8,000 to 12,000 m/s. The IDTs have a plurality of comb-tooth-shaped digit electrodes of which:
(a) the sum of the width of a digit electrode and the distance between the neighboring digit electrodes is expressed as $$dm+df = (3 \cdot v)/(2 \cdot f_0),$$

where dm: the width of the digit electrode,
df: the distance between the neighboring digit electrodes, and $f_0$: the center frequency of the third harmonic of the second Sezawa mode of the SAW;

(b) the sum of "dm+df" is 1.0 μm or more; and (c) the metal ratio "dm/(dm+df)" satisfies the formula 0.15<dm/(dm+df)<0.3 or the formula 0.7<dm/(dm+df) <0.85. The center frequency of the third harmonic of the second Sezawa mode of the SAW is 5 to 12 GHz.

A saw device of the present invention may have the IDTs having the digit electrodes of which the sum "dm+df" is 1.2 to 1.8 μm. In this case, the center frequency of the third harmonic of the second Sezawa mode of the SAW is 9.5 to 10.5 GHz.

As mentioned above, the present invention uses the third harmonic of the second Sezawa mode of the SAW excited by the IDTs. This enables the SAW device to obtain an excellent propagation property, electromechanical coupling coefficient, and frequency-temperature property at the superhigh-frequency range. Moreover, the present invention allows the use of wider digit electrodes in the IDTs, so that mass production of the SAW device can be easily achieved.

BEST MODE FOR CARRYING OUT THE INVENTION

Figure 1:
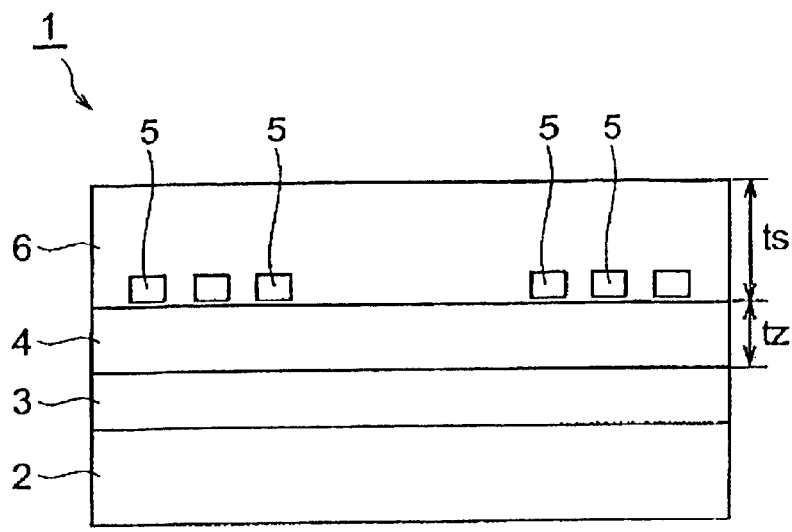
FIG. 1 is a schematic sectional view showing an embodiment of the SAW device of the present invention.

The embodiment of the present invention is explained below by referring to the accompanying drawings. In the drawings, the same element bears the same sign in order to eliminate duplicated explanations. The ratio of the dimensions in the drawings does not necessarily coincide with the explanation.

FIG. 1 shows a sectional view of a SAW device of the embodiment. As can be seen from the drawing, a SAW device 1 of the embodiment has a diamond layer 3 on a silicon substrate 2. The diamond constituting the diamond layer 3 may be either natural diamond or synthetic diamond. Furthermore, the diamond may be a single-crystalline diamond, a polycrystalline diamond, or an amorphous diamond. Although the diamond layer 3 shown in FIG. 1 is formed as a thin film on the silicon substrate 2, a single diamond body may be used without relying on a silicon substrate. In the case of synthetic diamond, the diamond layer may be formed by any method such as the CVD, ion-plating, PVD, or hot-filament method.

A ZnO layer 4 is formed on the diamond layer 3. It is desirable that the ZnO layer 4 be composed of ZnO having a c-axis orientation property. The term "c-axis orientation" is used to mean that the ZnO layer is formed in order for its (001) plane to be parallel to the substrate. When the formed ZnO layer has a c-axis orientation property, a SAW device can be materialized that fully exploits the innate piezoelectric property of ZnO.

Figure 2:
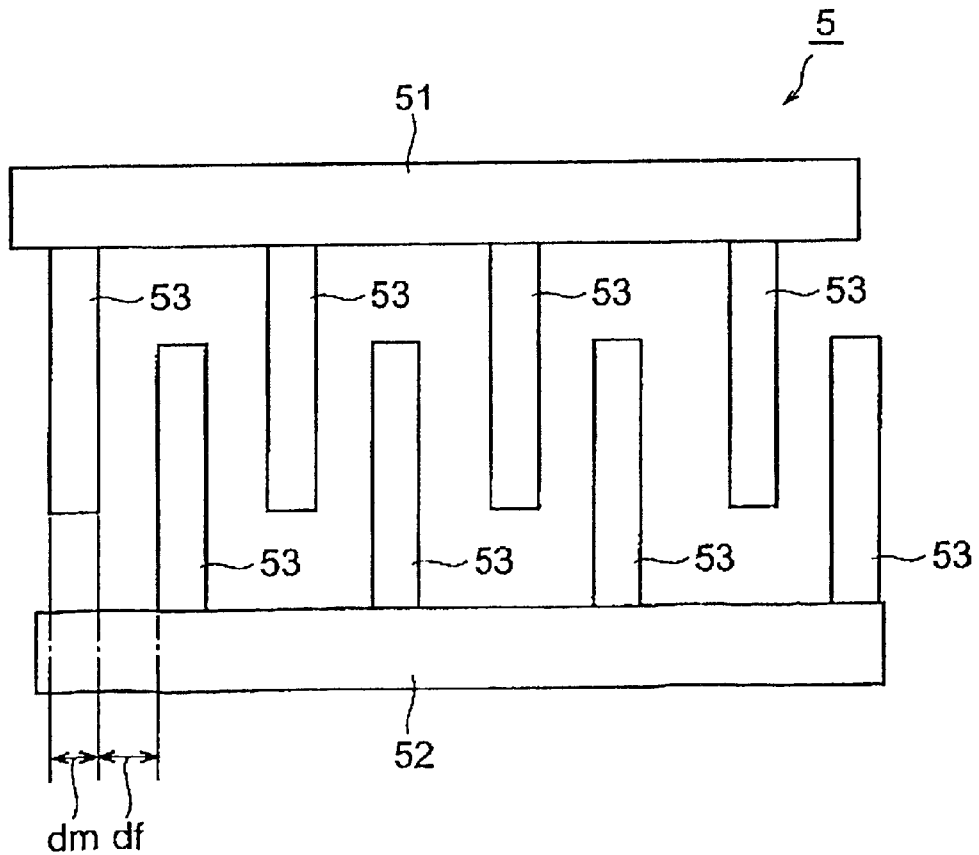
FIG. 2 is a schematic plan view showing the IDTs of the SAW device shown in FIG. 1.

IDTs 5 are formed on the ZnO layer 4. The IDTs 5 excite and receive SAWs. As shown in FIG. 2, the IDTs 5 sometimes take the form of a single-digit electrode type. The IDTs are provided with electrodes 51 and 52, which are placed so that they can face each other. They are provided with a number of comb-tooth-shaped digit electrodes 53, which protrude toward the opposite electrode. The value of "dm+df" of the digit electrodes 53 is expressed by equation (1) below.

$$dm+df=(3 \cdot v)/(2 \cdot f_0) \qquad (1),$$

where dm: the width of the digit electrode 53;

df: the distance between the neighboring digit electrodes 53;

v: the propagation velocity of the third harmonic of the second Sezawa mode of the SAW; and $f_0$: the center frequency of the third harmonic of the second Sezawa mode of the SAW.

When the propagation velocity v is 8,000 to 12,000 m/s, the digit electrodes 53 can be formed with the value of "dm+df" being 1.0 μm or more. This relatively large value allows the digit electrodes 53 to have a relatively wide width. This wide width facilitates the production of the IDTs 5, which in turn facilitates mass production of the SAW device 1.

Although the single-digit electrode type is shown in FIG. 2, the IDTs 5 may be a dual-digit electrode type, in which two digit electrodes 53 protruding from the same electrode are coupled.

As another alternative, reflecting electrodes, such as grating reflectors, may be provided at the outside of the input and the output IDTs such that both IDTs are placed between them. This configuration is referred to as a SAW resonator, in which the SAWs propagating between the input and output IDTs are subjected to multiple reflection between the IDTs and the reflecting electrodes to generate standing waves.

The IDTs 5 and other electrodes may be made of any conductive material, desirably aluminum in terms of processibility. When aluminum is used, a SAW's propagation velocity in the diamond layer 3 and the ZnO layer 4 decreases with increasing temperature and the velocity in the $SiO_2$ layer 6 increases with increasing temperature.

An $SiO_2$ layer 6 is formed on the ZnO layer 4 so that the $SiO_2$ layer 6 can cover the IDTs 5. The $SiO_2$ layer 6 improves the temperature property of the SAW device 1. It also acts as a protection layer for the piezoelectric body and the IDTs 5, notably reducing the effects of moisture and impurities from the environment.

It is desirable that the $SiO_2$ layer 6 be composed of amorphous $SiO_2$. The temperature dependence of the SAW's propagation velocity in the $SiO_2$ layer 6 is opposite to that in the diamond layer 3 and the ZnO layer 4. In other words, when the temperature of the SAW device 1 rises, for example, the SAW's propagation velocity in the $SiO_2$ layer 6 increases and that in the diamond layer 3 and the ZnO layer 4 decreases. As a result, the $SiO_2$ layer 6 compensates the temperature variation of a SAW's propagation velocity in the diamond layer 3 and the ZnO layer 4. Consequently, the temperature variation of the SAW's propagation velocity in the SAW device 1 is stabilized.

Examples of the SAW device 1 of the present invention are explained below. In these examples, SAW devices were produced by changing the thickness tz of the ZnO layer 4 as a piezoelectric body and the thickness ts of the SiO$_2$ layer 6 as a protective layer in order to obtain an optimum combination of the propagation velocity v, the electromechanical coupling coefficient K$^2$, and the frequency-temperature property TCF (TCF represents a temperature coefficient of frequency).

FIRST EXAMPLE

The SAW device in this example was produced as explained below.

A polycrystalline diamond layer having a thickness of 50 μm was formed on a silicon substrate with a size of 10×10×1 mm by using the microwave plasma CVD method. The surface of the diamond was polished with a diamond wheel to obtain a thickness of 20 μm. The polycrystalline diamond was produced by using a gas comprising CH$_4$ diluted by 100 times its volume of H$_2$.

A ZnO layer was formed on the polished surface of the diamond layer by sputtering polycrystalline ZnO using a mixed gas of argon and oxygen. The sputtering was carried out under the conditions of a substrate temperature of 400° C., an RF power of 160 W, and a pressure of 2.7 Pa. The thickness tz of the ZnO layer was varied in the range of 0.2 to 2.0 when expressed by kh1 by adjusting the sputtering time.

In the above description, kh1 is a parameter to express the thickness of the ZnO layer in relation to the wavelength λ of the fundamental wave of the second Sezawa mode of the SAW. Equation (2) below expresses this relationship.

$$kh1 = 2\pi \cdot (tz/\lambda_M) = 3 \cdot 2\pi \cdot (tz/\lambda) \qquad (2),$$

where $\lambda_M$: the wavelength of the third harmonic; $\lambda_M = \lambda/3$.

IDTs were formed on the ZnO layer by vapor-depositing aluminum by the resistance-heating method. The IDTs were of a single-digit electrode structure formed by a photolithographic procedure followed by etching. The width of the digit electrode of the IDTs was varied.

An amorphous-SiO$_2$ layer was formed on the ZnO layer so that the SiO$_2$ layer can cover the IDTs. The amorphous-SiO$_2$ layer was formed by sputtering SiO$_2$ with a mixed gas of argon and oxygen at a ratio of 1:1. The sputtering was carried out under the conditions of a substrate temperature of 150° C., an RF power of 200 W, and a pressure of 0.01 torr. The thickness ts of the SiO$_2$ layer was varied in the range of 0.05 to 1.6 when expressed by kh2 by adjusting the sputtering time.

In the above description, kh2 is a parameter to express the thickness of the SiO$_2$ layer in relation to the wavelength λ of the fundamental wave of the second Sezawa mode of the SAW. Equation (3) below expresses this relationship.

$$kh2 = 2\pi \cdot (ts/\lambda_M) = 3 \cdot 2\pi \cdot (ts/\lambda) \qquad (3).$$

Thus, SAW devices having the structure shown in FIG. 1 were produced with various thicknesses of the ZnO layer 4 and the SiO$_2$ layer 6. The SAW devices were subjected to the measurements below.

The propagation velocity v of the third harmonic of the second Sezawa mode of the SAW was measured by feeding superhigh-frequency power into the input electrodes, 51 and 52, to excite the SAW. The propagation velocity was obtained by using the relationship v=f$_0$·λ$_M$, where f$_0$ is the center frequency.

The electromechanical coupling coefficient K$^2$ of the SAW devices was obtained by measuring the radiation conductance, G, of the IDT at the second Sezawa mode of the SAW. The measurement was carried out by using a network analyzer (type: 8791A; Yokogawa Hewlett-Packard make). The coefficient K$^2$ was calculated by using equation (4) below.

$$K^2 = G/(8 \cdot f_0 \cdot C \cdot N) \qquad (4),$$

where f$_0$: the center frequency;

C: the total electrostatic capacity of the IDT; and

N: the number of pairs of digit electrodes of the IDT.

The frequency-temperature property TCF of the SAW devices was obtained by the relationship between the center frequency and temperature. A SAW device was heated by a heater from room temperature to 80° C. to measure the center frequency at 10° C. intervals. The relationship between the two was shown in a straight line, and the frequency-temperature property was calculated from the gradient of the line.

Accurate values of the thickness of the ZnO layer, tz, and that of the SiO$_2$ layer, ts, of the SAW device were measured after measuring the foregoing parameters. The SAW device was cut to measure the thicknesses by observing the sections under a scanning electron microscope (SEM). The parameters kh1 and kh2 were obtained by using the thicknesses tz and ts to evaluate the effects of kh1 and kh2 on the properties of the SAW device.

Figure 3:
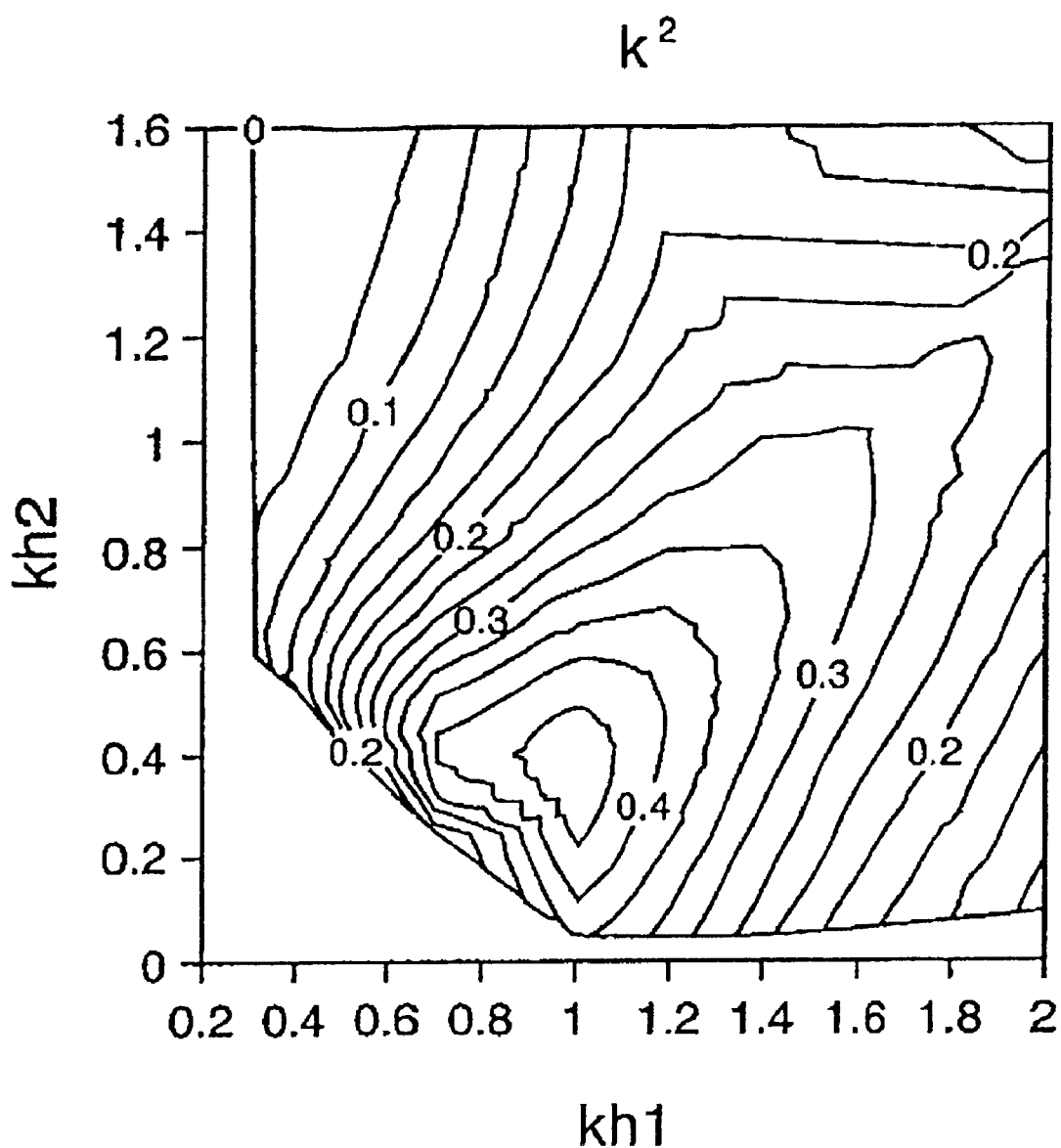
FIG. 3 is a graph showing the electromechanical coupling coefficient of the SAW device in the First Example.

FIG. 3 is a graph showing the relationship of the electromechanical coupling coefficient K$^2$ of the SAW device of this example to the thicknesses of the ZnO and SiO$_2$ layers. In the two-dimensional orthogonal-coordinate system of FIG. 3, the axis of abscissa represents the parameter kh1, which corresponds to the thickness of the ZnO layer (see equation (2) above), and the axis of ordinate represents kh2, which corresponds to the thickness of the SiO$_2$ layer (see equation (3) above). The numeral accompanying each curve signifies the value of the electromechanical coupling coefficient K$^2$, in the unit of percent, represented by the curve.

Figure 4:
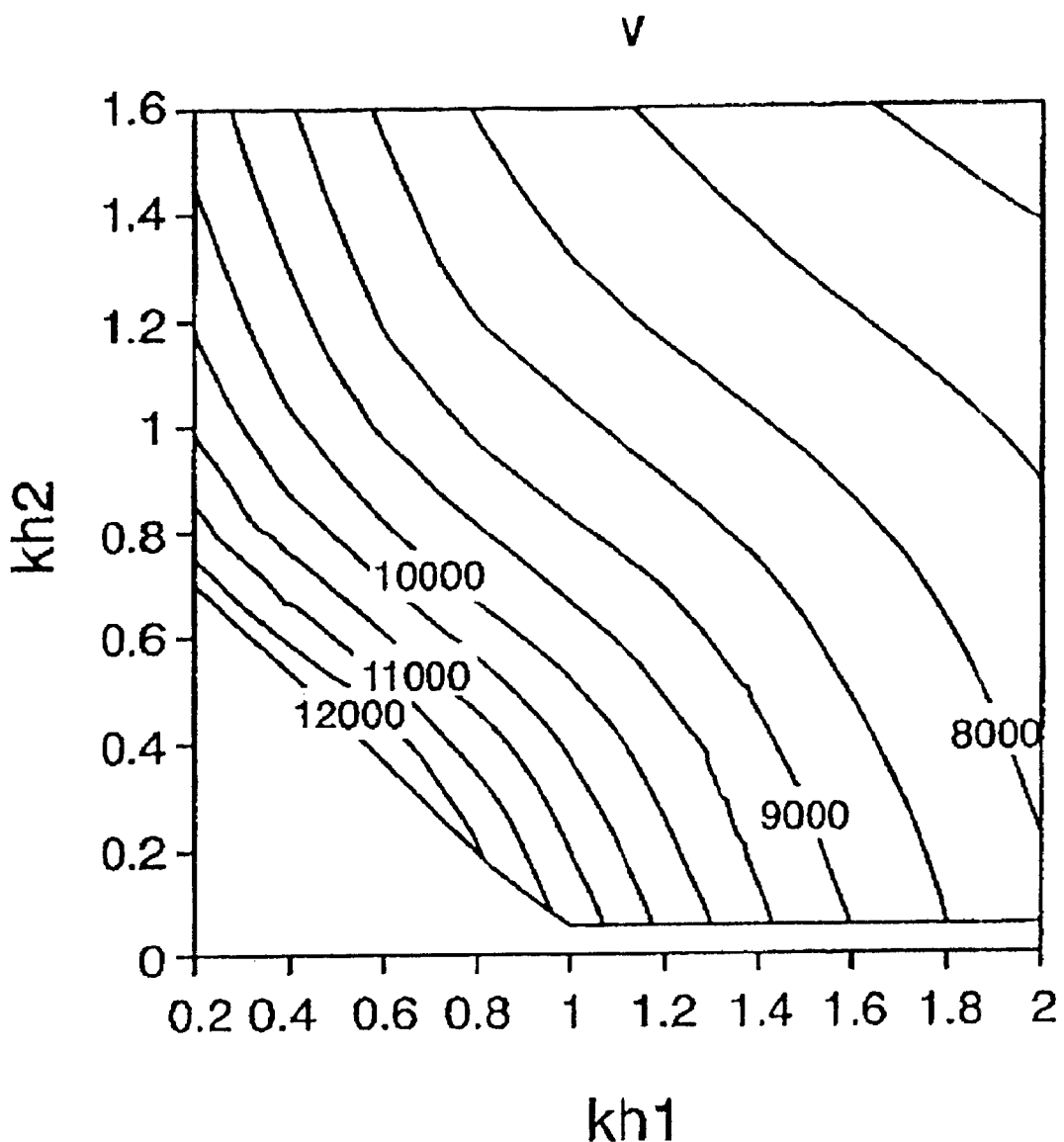
FIG. 4 is a graph showing the propagation property of the SAW device in the First Example.

FIG. 4 is a graph showing the relationship of the propagation velocity v of the SAW device of this example to the thicknesses of the ZnO and SiO$_2$ layers. In the two-dimensional orthogonal-coordinate system of FIG. 4, the axis of abscissa represents the parameter kh1, which corresponds to the thickness of the ZnO layer, and the axis of ordinate represents kh2, which corresponds to the thickness of the SiO$_2$ layer. The numeral accompanying each curve signifies the value of the propagation velocity v, in the unit of m/s, represented by the curve.

Figure 5:
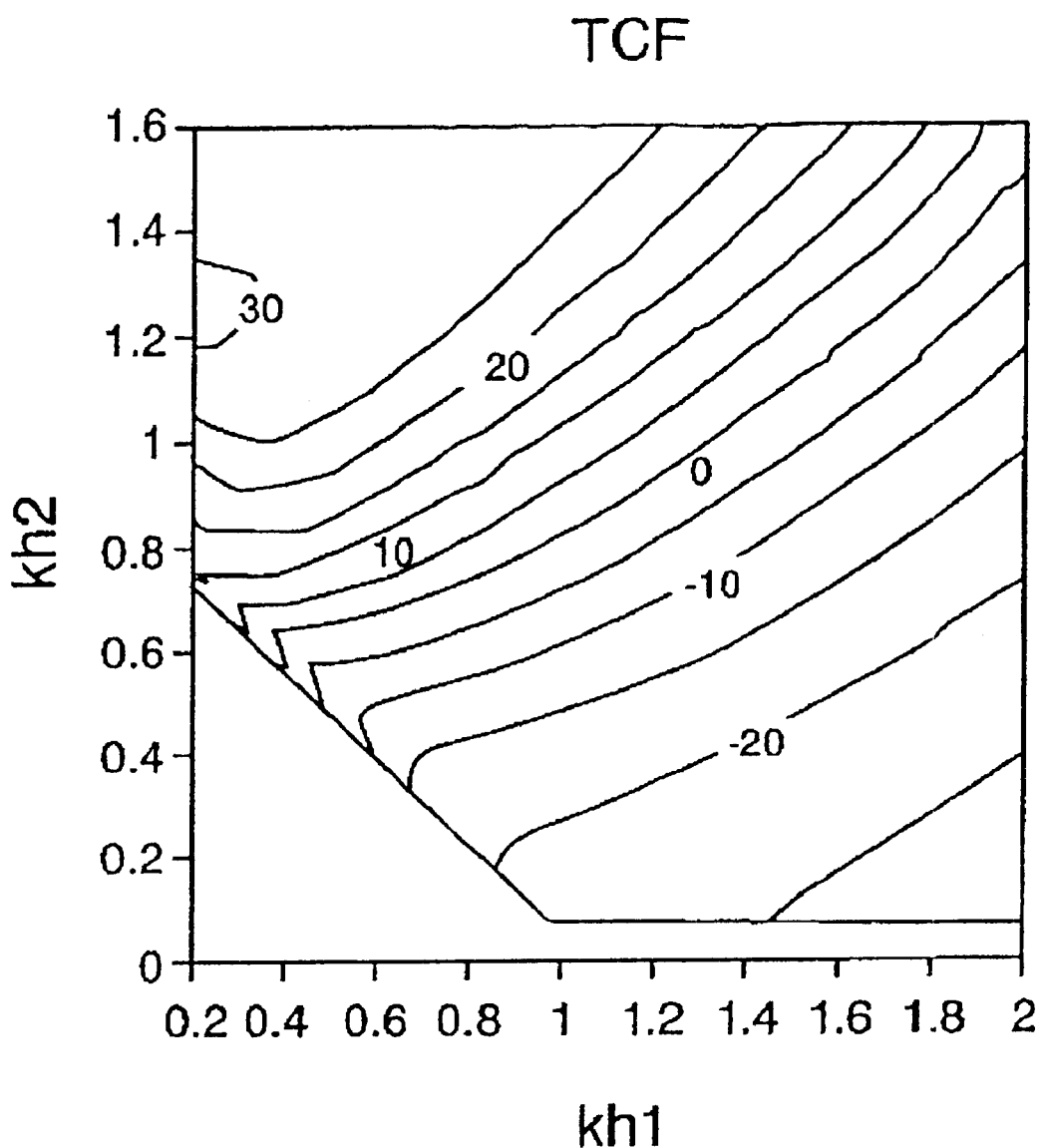
FIG. 5 is a graph showing the frequency-temperature property of the SAW device in the First Example.

FIG. 5 is a graph showing the relationship of the frequency-temperature property TCF of the SAW device of this example to the thicknesses of the ZnO and SiO$_2$ layers. In the two-dimensional orthogonal-coordinate system of FIG. 5, the axis of abscissa represents the parameter kh1, which corresponds to the thickness of the ZnO layer, and the axis of ordinate represents kh2, which corresponds to the thickness of the SiO$_2$ layer. The numeral accompanying each curve signifies the value of the frequency-temperature property TCF, in the unit of ppm/° C., represented by the curve.

Figure 6:
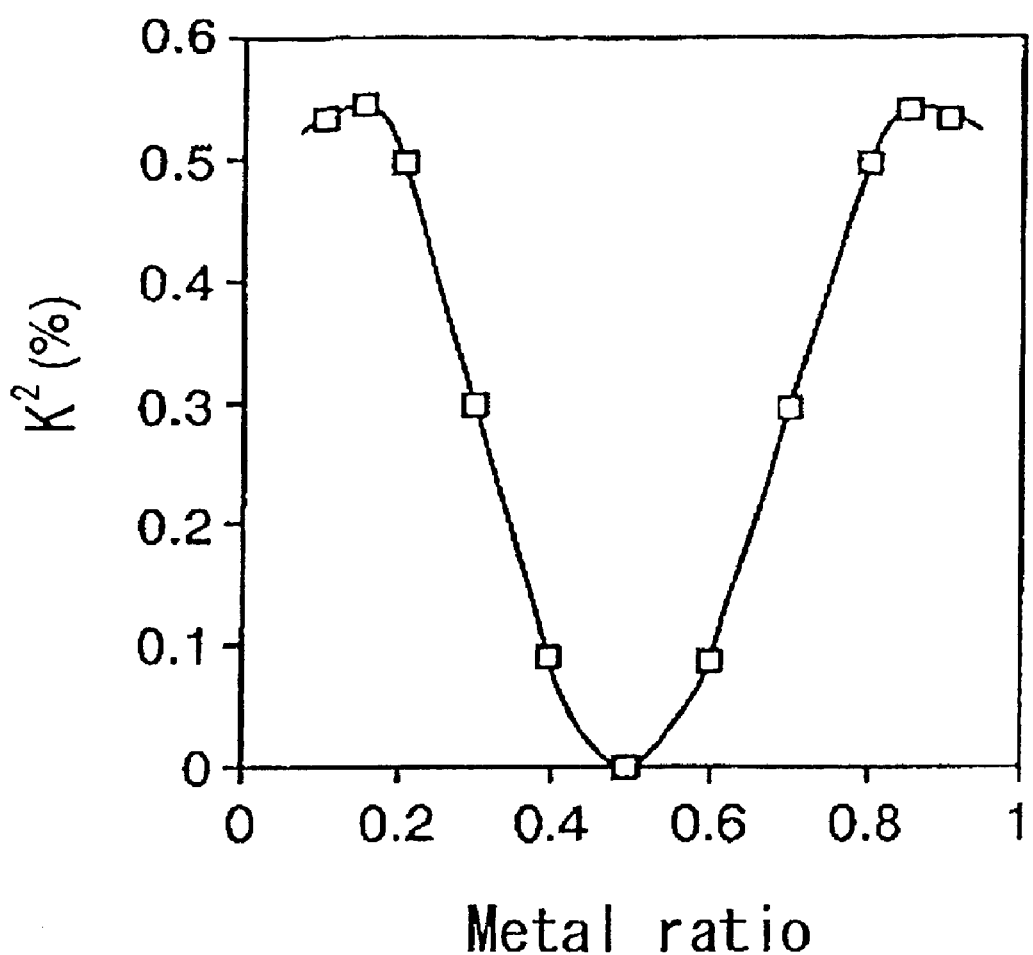
FIG. 6 is a graph showing the relationship between the electromechanical coupling coefficient and the metal ratio for the SAW device in the First Example.

FIG. 6 is a graph showing the relationship of the electromechanical coupling coefficient K$^2$ of the SAW device of this example to the metal ratio when the metal ratio is changed by altering the width of the digit electrodes of the IDTs. Here, the metal ratio represents the ratio dm/(dm+df), where dm is the width of the digit electrode and df is the distance between the neighboring digit electrodes.

Figure 7:
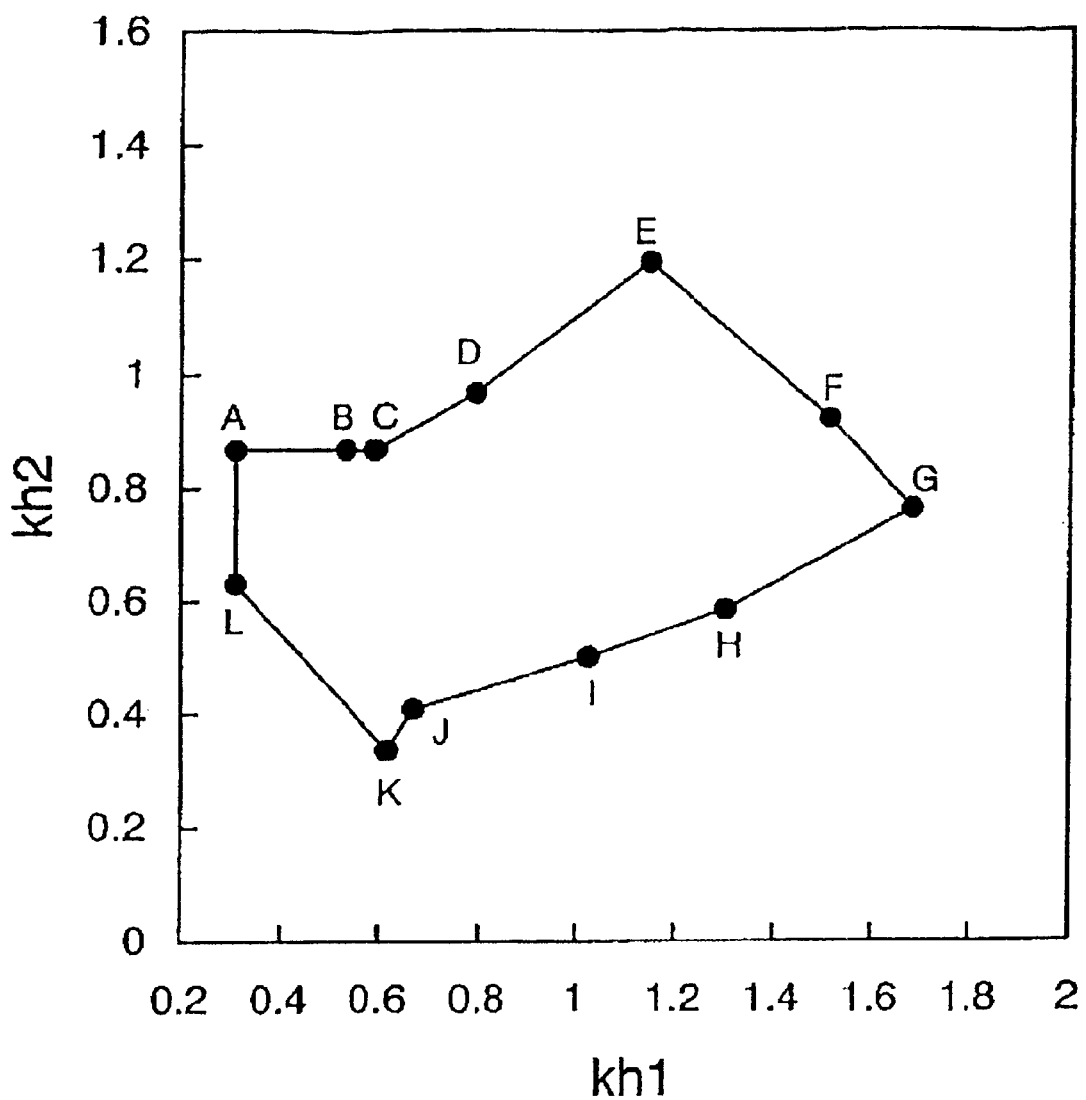
FIG. 7 is a graph showing the parameters kh1 and kh2 for the SAW device in the First Example.

FIG. 7 shows the numerical ranges of kh1 and kh2 in which the electromechanical coupling coefficient $K^2$ (falls in the range of 0.03 to 0.5% in FIG. 3, the propagation velocity v falls in the range of 8,000 to 12,000 m/s in FIG. 4, and the frequency-temperature property TCF falls in the range of −15 to +15 ppm/° C. in FIG. 5.

As is the case of FIGS. 3 to 5, FIG. 7 shows a graph in a two-dimensional orthogonal-coordinate system in which the axis of abscissa represents kh1 and the axis of ordinate represents kh2. In FIG. 7, the numerical ranges of kh1 and kh2 in which the electromechanical coupling coefficient $K^2$ falls in the range of 0.03 to 0.5%, the propagation velocity v falls in the range of 8,000 to 12,000 m/s, and the frequency-temperature property TCF falls in the range of −15 to +15 ppm/° C. are given by a range that is produced by connecting sequentially the points A, B, C, D, E, F, G, H, I, J, K, L, and A and that includes the surrounding lengths of lines.

In the above description:
point A given by the coordinates "kh1=0.30 and kh2=0.87";
point B given by the coordinates "kh1=0.54 and kh2=0.87";
point C given by the coordinates "kh1=0.60 and kh2=0.87";
point D given by the coordinates "kh1=0.81 and kh2=0.97";
point E given by the coordinates "kh1=1.16 and kh2=1.20";
point F given by the coordinates "kh1=1.52 and kh2=0.93";
point G given by the coordinates "kh1=1.69 and kh2=0.77";
point H given by the coordinates "kh1=1.31 and kh2=0.59";
point I given by the coordinates "kh1=1.04 and kh2=0.50";
point J given by the coordinates "kh1=0.68 and kh2=0.40";
point K given by the coordinates "kh1=0.63 and kh2=0.33";
point L given by the coordinates "kh1=0.30 and kh2=0.63".

In other words, a SAW device having an electromechanical coupling coefficient, $K^2$, of 0.03 to 0.5%, a propagation velocity, v, of 8,000 to 12,000 m/s, and a frequency-temperature property, TCF, of −15 to +15 ppm/° C. can be obtained when the SAW device is operated by using the third harmonic of the second Sezawa mode of the SAW excited and when the SAW device is constituted so that the numerical ranges of kh1 and kh2 can fall in a range that is produced by connecting sequentially the points A, B, C, D, E, F, G, H, I, J, K, L, and A as shown in FIG. 7 and that includes the surrounding lengths of lines.

When the SAW device is operated at a propagation velocity, v, of 8,000 to 12,000 m/s, the digit electrodes of the IDTs can be formed such that the sum of the width of the digit electrode and the distance between the neighboring digit electrodes is 1.0 μm or more as can be derived from equation (1) above. This relatively large value facilitates the production of the IDTs, which in turn facilitates mass production of the SAW device.

When the IDTs is provided such that the sum of the width of the digit electrode and the distance between the neighboring digit electrodes is 1.0 μm or more and the third harmonic of the second Sezawa mode of the SAW has a center frequency of 5.0 to 12.0 GHz, more desirably 9.5 to 10.5 GHz, the above-described property ranges of the electromechanical coupling coefficient $K^2$, the propagation velocity v, and the frequency-temperature property TCF can be obtained.

Furthermore, as can be seen from FIG. 6, when the IDTs is provided with a metal ratio of 0.15 to 0.3 or 0.7 to 0.85, the electromechanical coupling coefficient $K^2$ can take the satisfactory value of 0.03 to 0.5%.

SECOND EXAMPLE

The SAW device in this example was produced by procedures similar to those in the First Example, with some conditions modified. The SAW device was intended for operation at a center frequency of 9.5 to 10.5 GHz.

In producing the SAW device, the thickness tz of the ZnO layer was adjusted to obtain the parameter kh1 of 0.6, and the thickness ts of the $SiO_2$ layer was adjusted to obtain the parameter kh2 of 0.7. The width of the digit electrode of the IDTs was altered to change the metal ratio.

Figure 8:
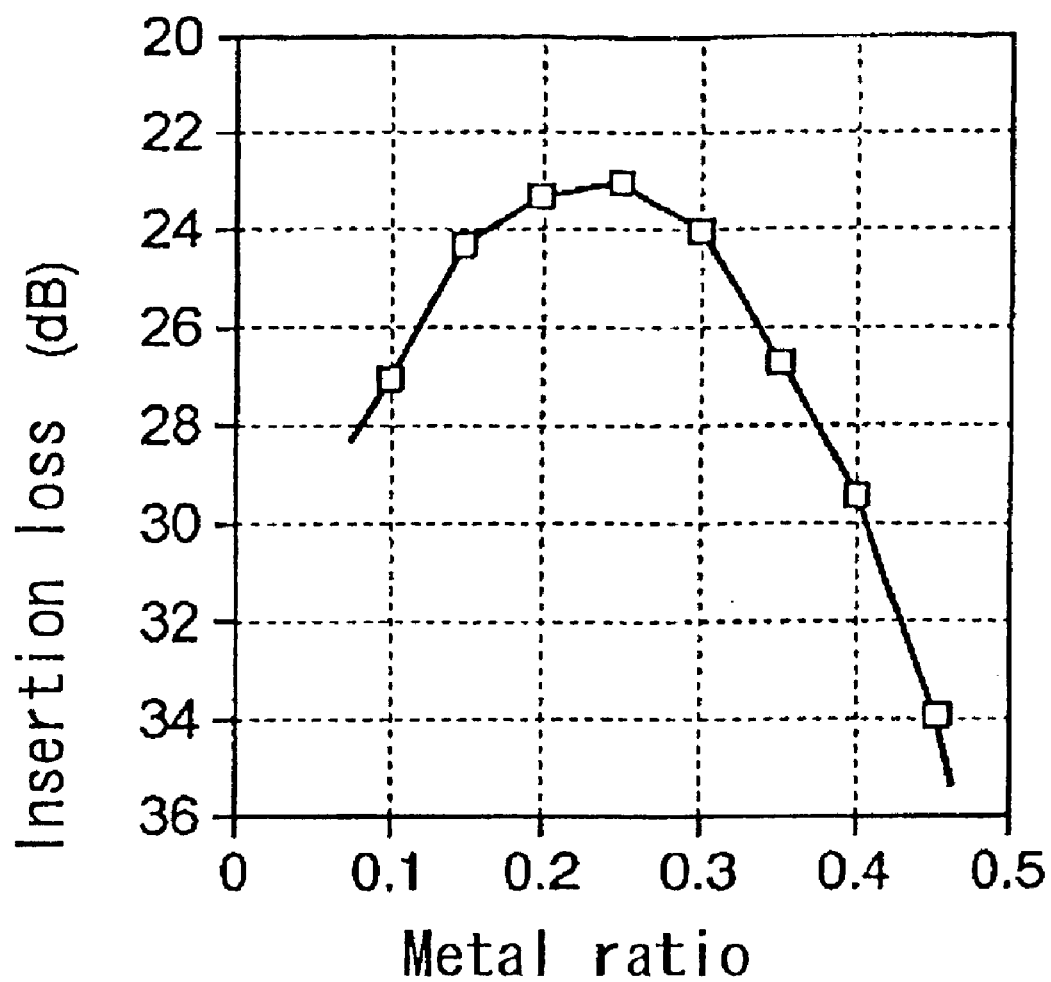
FIG. 8 is a graph showing the relationship between the insertion loss and the metal ratio for the SAW device in the Second Example.

FIG. 8 shows the relationship between the insertion loss and the metal ratio. Here, the term "insertion loss" represents the ratio, expressed in decibels (dB), of the output power to the input power. As can be seen from FIG. 8, the insertion loss decreases toward its minimum value as the metal ratio approaches the vicinity of 0.2. In other words, as the metal ratio decreases from the vicinity of 0.2 or increases from the vicinity of 0.2, the insertion loss increases gradually. Therefore, it is desirable that the metal ratio be in the vicinity of 0.2, more specifically in the range of 0.15 to 0.3.

INDUSTRIAL APPLICABILITY

As explained above, the present invention uses the third harmonic of the second Sezawa mode of the SAW excited. This enables a SAW device to obtain an excellent propagation property, electromechanical coupling coefficient, and frequency-temperature property at the superhigh-frequency range. Moreover, the present invention allows the use of wider digit electrodes in the IDTs, so that mass production of the SAW device can be easily achieved.

What is claimed is:

1. A surface acoustic wave (SAW) device, being specified by the conditions of:
    (a) the SAW device comprising:
        (a1) a diamond layer;
        (a2) a ZnO layer:
            (a2a) being formed on the diamond layer; and
            (a2b) having a thickness of tz,
        (a3) interdigital transducers (IDTs):
            (a3a) being formed on the ZnO layer; and
            (a3b) having the function of exciting and receiving a SAW, and
        (a4) an $SiO_2$ layer:
            (a4a) being formed on the ZnO layer so that the $SiO_2$ layer can cover the IDTs; and
            (a4b) having a thickness of ts
    (b) providing a two-dimensional orthogonal-coordinate system, in which the axis of abscissa represents kh1 and the axis of ordinate represents kh2, where kh1 is expressed by the equation kh1=3·2π(tz/λ) and kh2 is expressed by the equation kh2=3·2π(ts/λ), λ signifying the wavelength of the fundamental wave of the second Sezawa mode of the SAW;

(c) in the orthogonal-coordinate system connecting sequentially;

point A given by the coordinates "kh1=0.30 and kh2=0.87";

point B given by the coordinates "kh1=0.54 and kh2=0.87";

point C given by the coordinates "kh1=0.60 and kh2=0.87";

point D given by the coordinates "kh1=0.81 and kh2=0.97";

point E given by the coordinates "kh1=1.16 and kh2=1.20";

point F given by the coordinates "kh1=1.52 and kh2=0.93";

point G given by the coordinates "kh1=1.69 and kh2=0.77";

point H given by the coordinates "kh1=1.31 and kh2=0.59";

point I given by the coordinates "kh1=1.04 and kh2=0.50";

point J given by the coordinates "kh1=0.68 and kh2=0.40";

point K given by the coordinates "kh1=0.63 and kh2=0.33";

point L given by the coordinates "kh1=0.30 and kh2=0.63"; and point A to provide the range ABCDEFGHIJKLA surrounded by 12 lengths of lines;

(d) structuring the SAW device so that kh1 and kh2 can fall in the range ABCDEFGHIJKLA including the surrounding 12 lengths of lines;

(e) using the third harmonic of the second Sezawa mode of the SAW excited (f) the third harmonic of the second Sezawa mode of the SAW having propagation velocity, denoted by v, of 8,000 to 12,000 m/s;

(g) the IDTs having a plurality of comb-tooth-shaped digit electrodes of which:

(g1) the sum of the width of a digit electrode and the distance between the neighboring digit electrodes is expressed as $$dm+df=(3\cdot v)/(2\cdot f_0),$$

where dm: the width of the digit electrode, df: the distance between the neighboring digit electrodes, and $f_0$: the center frequency of the third harmonic of the second Sezawa mode of the SAW:

(g2) the sum "dm+df" is 1.0 $\mu$m or more; and (g3) the ratio "dm/(dm+df)", which is referred to as the metal ratio, satisfies the formula 0.15<dm/(dm+df)<0.3 or the formula 0.7<dm/(dm+df)<0.85; and (h) the center frequency of the third harmonic of the second Sezawa mode of the SAW being 5 to 12 GHz.

2. A SAW device as defined in claim 1, wherein:

(a) the IDTs have the digit electrodes of which the sum "dm+df" is 1.2 to 1.8 $\mu$m; and (b) the center frequency of the third harmonic of the second Sezawa mode of the SAW is 9.5 to 10.5 GHz.

* * * * *